(12) United States Patent
Hsu (10) Patent No.: US 7,881,070 B2
(45) Date of Patent: Feb. 1, 2011

(54) CIRCUIT BOARD HAVING POWER SOURCE

(75) Inventor: Shih-Ping Hsu, Taiwan (CN)

(73) Assignee: Unimicron Technology Corp., Taoyuan (TW)

( * ) Notice: Subject to any disclaimer, the term of this patent is extended or adjusted under 35 U.S.C. 154(b) by 297 days.

(21) Appl. No.: 12/313,484

(22) Filed: Nov. 19, 2008

(65) Prior Publication Data

US 2009/0129040 A1    May 21, 2009

(30) Foreign Application Priority Data

Nov. 19, 2007    (TW) .............................. 96143642 A (51) Int. Cl.
*H05K 1/18* (2006.01)
(52) U.S. Cl. .................... 361/763; 361/760; 361/761; 361/767; 174/262
(58) Field of Classification Search ............ 361/728, 361/736, 748, 679.01, 751, 760–762, 767, 361/779, 783, 790, 793, 795, 807, 808, 523–533, 361/763, 766, 771, 738, 782, 821, 830, 752; 174/255, 250, 256, 260, 261, 262, 557
See application file for complete search history.

(56) References Cited

U.S. PATENT DOCUMENTS

| | | | |
|---|---|---|---|
| 6,528,732 B1 * | 3/2003 | Okubora et al. ............ 174/255 |
| 6,707,662 B2 * | 3/2004 | Waffenschmidt et al. ..... 361/523 |
| 2005/0088833 A1 * | 4/2005 | Kikuchi et al. .............. 361/763 |
| 2007/0242440 A1 * | 10/2007 | Sugaya et al. ............... 361/762 |
| 2008/0259526 A1 * | 10/2008 | Yoshida et al. .............. 361/523 |
| 2009/0084172 A1 * | 4/2009 | Fukagai et al. ........... 73/114.72 |
| 2009/0185357 A1 * | 7/2009 | Rendek et al. .............. 361/762 |
| 2010/0085684 A1 * | 4/2010 | Suh et al. .................... 361/503 |

* cited by examiner

*Primary Examiner*—Dameon E Levi
*Assistant Examiner*—Hoa C Nguyen
(74) *Attorney, Agent, or Firm*—Peter F. Corless; Steven M. Jensen; Edwards Angell Palmer & Dodge LLP (57) ABSTRACT

A circuit board having a power source is provided, including: a carrier board having a first dielectric layer disposed on at least a surface thereof and a first circuit layer disposed on the first dielectric layer, wherein the first circuit layer has at least an electrode pad; a first electrode plate disposed on the electrode pad; an insulating frame member disposed on the first electrode plate, with a portion of the first electrode plate being exposed from the insulating frame member, wherein electrolyte is received in the insulating frame member and in contact with the first electrode plate; and a porous second electrode plate disposed on the insulating frame member and the electrolyte, the second electrode plate being in contact with the electrolyte, so as to provide the power source for the circuit board.

16 Claims, 6 Drawing Sheets

CIRCUIT BOARD HAVING POWER SOURCE

BACKGROUND OF THE INVENTION

1. Field of the Invention

The present invention relates to circuit boards, and more particularly, to a circuit board having a power source.

2. Description of the Prior Art

Power systems with compact size, light weight and high energy density are in great demand, for use in electronic/communication/3C products that are wireless and portable and have high-performance components having miniaturized profiles. Accordingly, more and more efforts are put in developing new energy solutions having smaller size, higher energy density, better safety and greater environment-friendliness. One of such energy solutions is so-called miniaturized "fuel cell".

Fuel cells serve as a power generating device, and unlike rechargeable cells or disposable non-rechargeable cells, fuel cells must be fueled to maintain the power provided thereby, as the name suggests. Hydrogen is the fuel for fuel cells, such that fuel cells are considered as the "new energy" power system. As fuel cells have desirable properties of low pollution and efficient energy conversion, they have become a new generation power supply technology. A fuel cell works by reversing the process of electrolyzing water into oxygen and hydrogen, that is, electricity and water are produced. In other words, the fuel cell generates electricity by combining oxygen and hydrogen to form water. There are five types of fuel cells as follows:

(1) Alkaline Fuel Cell (AFC), using potassium hydroxide as electrolyte;
(2) Phosphoric Acid Fuel Cell (PAFC), using phosphoric acid ($H_3PO_4$) solution as electrolyte;
(3) Molten Carbonate Fuel Cell (MCFC), using molten carbonate as electrolyte;
(4) Solid Oxide Fuel Cell (SOFC), using zirconium dioxide as electrolyte; and
(5) Proton Exchange Membrane Fuel Cell (PEMFC), comprising Direct Methanol Fuel Cell (DMFC), directly using methanol as fuel, without in advance forming hydrogen gas.

Despite their variety, all the fuel cells substantially have an anode, a cathode, and solid or liquid electrolyte between the anode and the cathode.

Figure 1:
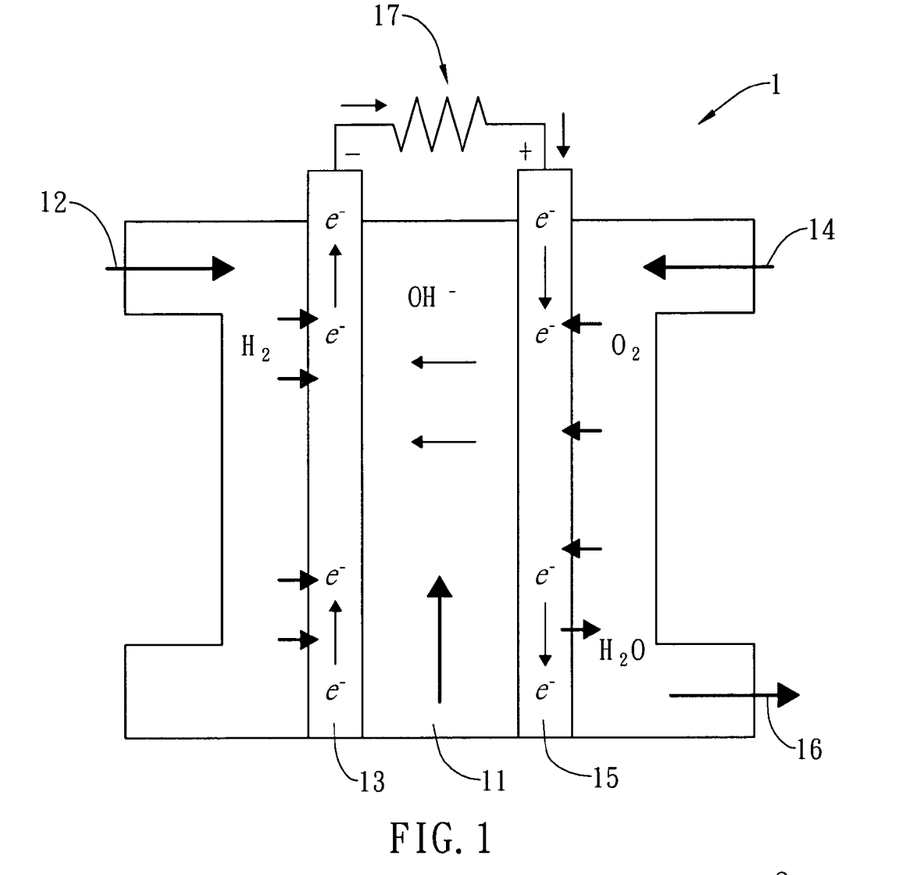
FIG. 1 is a schematic diagram showing the principle of power generation of a fuel cell.

FIG. 1 schematically shows a full cell (an alkaline fuel cell 1 is exemplified) to illustrate the principle of power generation thereof. The alkaline fuel cell 1 uses potassium hydroxide (KOH) 11 as electrolyte. Hydrogen gas 12 enters the fuel cell 1 via an anode 13, and oxygen gas 14 (or air) enters the fuel cell 1 via a cathode 15. Reactants at the anode 13 and the cathode 15, driven by oxidation-reduction potential and in the presence of a catalyst, undergo the following reactions:

anode half-reaction: $2H_2+4OH^- \rightarrow 4H_2O+4e^-$ cathode half-reaction: $O_2+2H_2O+4e^- \rightarrow 4OH^-$ full reaction: $2H_2+O_2 \rightarrow 2H_2O$.

The hydrogen gas 12 in contact with the anode 13 and $OH^-$ ions released by dissociation of the potassium hydroxide (KOH) 11 undergo an oxidation half-reaction, so as to produce water 16 and release electrons that are absorbed by the anode 13. Concurrently, the cathode 15 releases electrons, and the electrons, the oxygen gas 14 in contact with the cathode 15 and water 16 undergo a reduction half-reaction to produce $OH^-$ ions. As a result, a stream of electrons from the anode 13 through an external circuit 17 to the anode 15 is generated. According to the full reaction, water 16 is the only product discharged by the fuel cell 1. By the chemical reaction of hydrogen and oxygen to produce electricity and water, the fuel cell 1 causes no pollution and eliminates the need of time-consuming recharging required by conventional rechargeable cells, thereby representing a prominent new power source.

For the mainstream electronic products nowadays, semiconductor packages and power source components are separately fabricated, and then they are electrically interconnected and assembled. Normally, a fuel cell is disposed within a metal frame, and usually occupies a considerable space, thereby not favorable for miniaturization of the electronic products. And, there is usually a relatively long path of electrical connection between the semiconductor packages and the power source components, thereby undesirably increasing power consumption.

Figure 2:
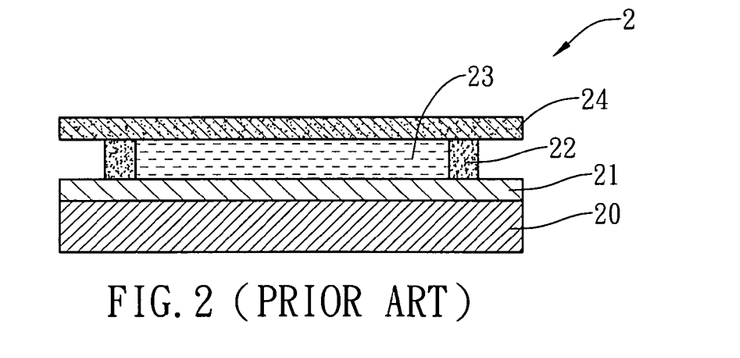
FIG. 2 is a schematic diagram showing a conventional fuel cell.

Accordingly, miniaturized fuel cells have become the focus of cell development in the industry. Referring to FIG. 2, which schematically shows a miniaturized fuel cell 2, the fuel cell 2 comprises: an electronically functional silicon substrate 20; a first metal layer 21 formed on the silicon substrate 20 and serving as an anode; an insulating frame member 22 disposed on the first metal layer 21, for receiving electrolyte 23 therein; and a porous second metal layer 24 formed on the insulating frame member 22 and serving as a cathode. Both the first metal layer 21 (the anode) and the second metal layer 24 (the cathode) are in contact with the electrolyte 23 inside the insulating frame member 22 so as to form a path for providing power to the silicon substrate 20.

However, the silicon substrate 20 of the fuel cell 2 is fragile and is not cost-effective to fabricate, and its raw materials are not reliably available. And, the electrolyte 23 carried by the silicon substrate 20 is susceptible to leakage. As such, the fuel cell 2 is not meeting the need for miniaturization.

Therefore, the problem to be solved here is to improve existing fuel cells so as to achieve multi-module system integration for the sake of miniaturization and versatility thereof.

SUMMARY OF THE INVENTION

In view of the aforesaid drawbacks of the prior art, an objective of the present invention is to provide a circuit board having a power source so as to miniaturize fuel cells.

Another objective of the present invention is to provide a circuit board having a power source, which is compact and highly reliable.

Still another objective of the present invention is to provide a circuit board having a power source, so as to achieve multi-module system integration for the purpose of versatility.

A further objective of the present invention is to provide a circuit board having a power source, which can be integrated with a fuel cell so as to shorten the circuit layout and reduce power consumption.

A further objective of the present invention is to provide a circuit board having a power source, so as to facilitate supply of raw materials, large-area processing, reduction of costs, and mass production.

To achieve the above and other objectives, the present invention provides a circuit board having a power source, including: a carrier board having a first dielectric layer disposed on at least a surface thereof and a first circuit layer disposed on the first dielectric layer, wherein the first circuit layer has at least an electrode pad; a first electrode plate disposed on the electrode pad; an insulating frame member disposed on the first electrode plate, with a portion of the first electrode plate being exposed from the insulating frame member, wherein electrolyte is received in the insulating frame member and in contact with the first electrode plate; and a porous second electrode plate disposed on the insulating frame member and the electrolyte, wherein the second electrode plate is in contact with the electrolyte.

The above circuit board further includes: a second dielectric layer formed on the first dielectric layer, the first circuit layer and the second electrode plate, wherein the second dielectric layer has at least a cavity therein to expose the second electrode plate; and a second circuit layer formed on the second dielectric layer, wherein the second circuit layer has at least a first conductive pad, and at least a first conductive via and a second conductive via both formed in the second dielectric layer and electrically connecting to the first circuit layer and the second electrode plate respectively.

For the above circuit board, the carrier board is an organic insulating board or an organic circuit board having inner circuit layers. The first electrode plate is made of zinc (Zn), aluminum (Al) or magnesium (Mg), and is electrically conductive as well as reactive with the electrolyte so as to provide a source of hydrogen. The electrolyte is an $OH^-$-containing alkaline solution such as hydrogen peroxide ($H_2O_2$), sodium hydroxide (NaOH) or potassium hydroxide (KOH). The insulating frame member comprises a pore-free insulating resin resistant to acid and alkali, or comprises a mixture of organic and inorganic materials. The insulating frame member is round, rectangular, or polygonal. The second electrode plate is a porous metal board. Alternatively, the second electrode plate is a porous insulating board, and a metal film is disposed on surfaces of pores of the porous insulating board. The porous insulating board can be made of aluminum oxide ($Al_2O_3$). The metal film is made of copper (Cu), platinum (Pt), nickel (Ni), or gold (Au).

The circuit board of the present invention further includes a built-up circuit structure disposed on the second dielectric layer and the second circuit layer. The built-up circuit structure comprises: at least a third dielectric layer and a third circuit layer stacked on the third dielectric layer, the third circuit layer having a plurality of second conductive pads, wherein a plurality of third conductive vias are disposed in the third dielectric layer and electrically connecting to the second and third circuit layers. An insulating protective layer is disposed on the built-up circuit structure. A plurality of openings are disposed in the insulating protective layer to expose the second conductive pads. The built-up circuit structure further has at least an opening corresponding to the cavity of the second dielectric layer.

The circuit board of the present invention further comprises: conductive components disposed on the second conductive pads, and electrically connected to a semiconductor chip by conductive bumps or bonding wires.

Therefore, according to the circuit board having a power source in the present invention, a carrier board is provided, and a first circuit layer having at least an electrode pad is disposed on the carrier board. A fuel cell, which comprises a first electrode plate, an insulating frame member, electrolyte, and a second electrode plate, is disposed on the electrode pad. A second dielectric layer having at least a cavity therein is disposed on the second electrode plate and the first circuit layer. A second circuit layer is disposed on the second dielectric layer, wherein the second circuit layer has at least a first conductive pad, at least a first conductive via, and at least a second conductive via therein, electrically connecting to the first circuit layer and the second electrode plate, respectively. The first circuit layer is electrically connected via its electrode pad to the first electrode plate. The second electrode plate obtains oxygen gas ($O_2$) (which is required for reaction) from an external environment through the cavity of the second dielectric layer. An electron stream produced by an oxidation reaction and a reduction reaction concurrently conducted at the first electrode plate and the second electrode plate, respectively, provides electric power for the circuit board by means of the first and second circuit layers. With a direct combination of the fuel cell and the circuit board in the present invention, the drawback of a considerable space occupied by a fuel cell disposed in a metal frame in the prior art is eliminated, and with the conductive vias being disposed in the circuit board of the present invention, a circuit layout distance can be shortened and thereby power consumption is reduced. Also, the circuit board incorporated with the fuel cell is light in weight and is less susceptible to cracking, thereby resolving the drawbacks of a conventional miniaturized fuel cell using a silicon substrate that is fragile, has unreliable supply of raw materials and is cost-ineffective to fabrication and the drawback of leakage of electrolyte in the prior art. Moreover, the circuit board of the present invention may incorporate multi-module chips for the purpose of versatility.

BRIEF DESCRIPTION OF THE DRAWINGS

FIG. 3N' is a schematic diagram of another embodiment of the structure shown in FIG. 3N.

DETAILED DESCRIPTION OF THE PREFERRED EMBODIMENTS

Preferred embodiments of a circuit board having a power source and a method for fabricating the same proposed by the present invention are described in detail as follows with reference to FIGS. 3A to 3N and FIG. 3N'. It should be understood that the drawings are simplified schematic diagrams only showing the components relevant to the present invention, and the layout of components could be more complicated in practical implementation.

Figure 3A:
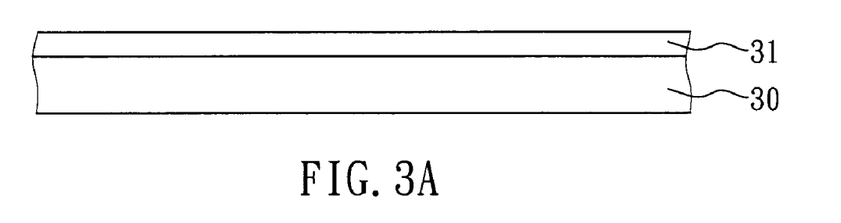
FIGS. 3A to 3N are cross-sectional views of a method for fabricating a circuit board having a power source according to the present invention.
Figure 3B:
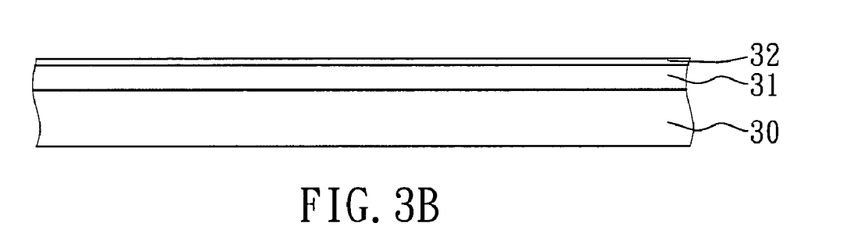
Figure 3C:
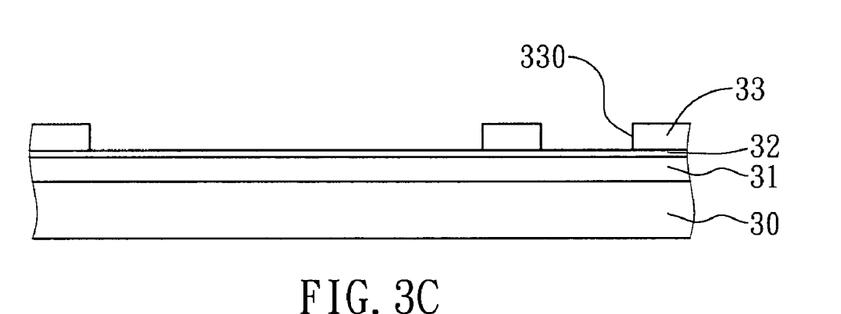
Figure 3D:
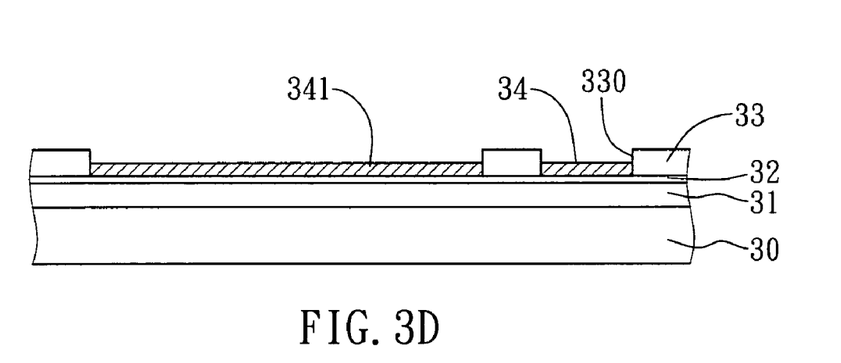
Figure 3E:
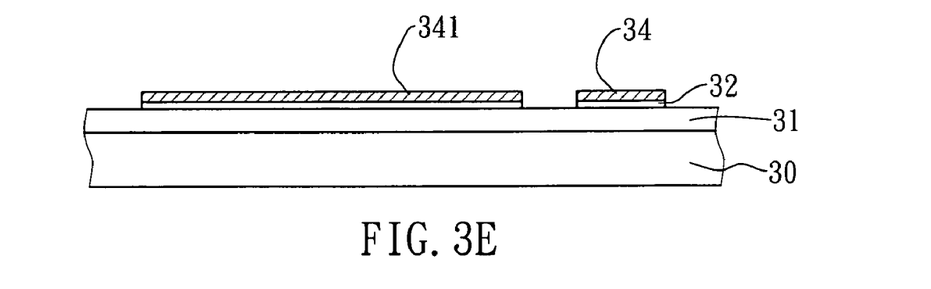
Figure 3F:
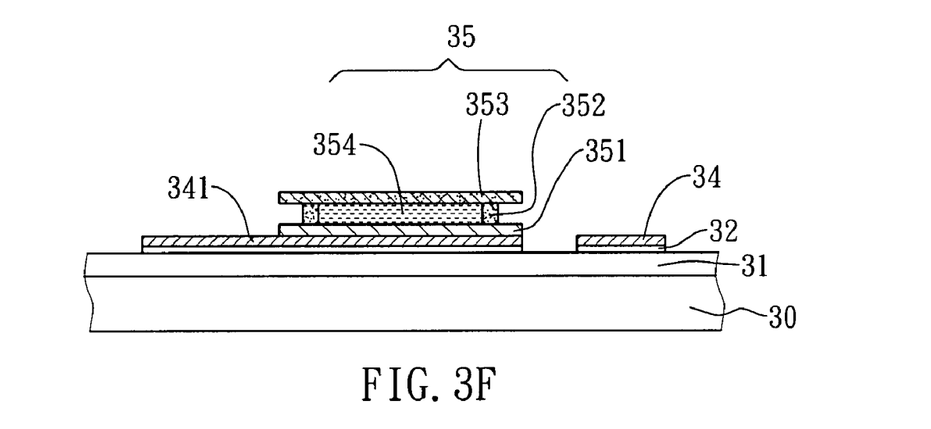
Figure 3G:
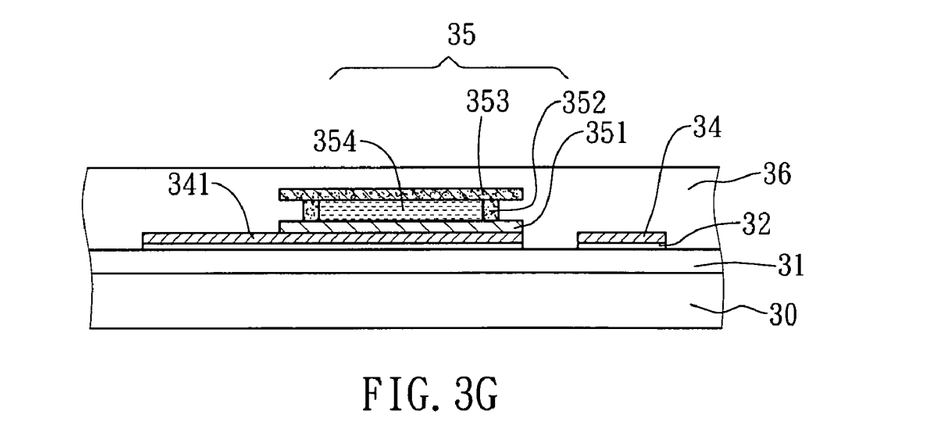
Figure 3H:
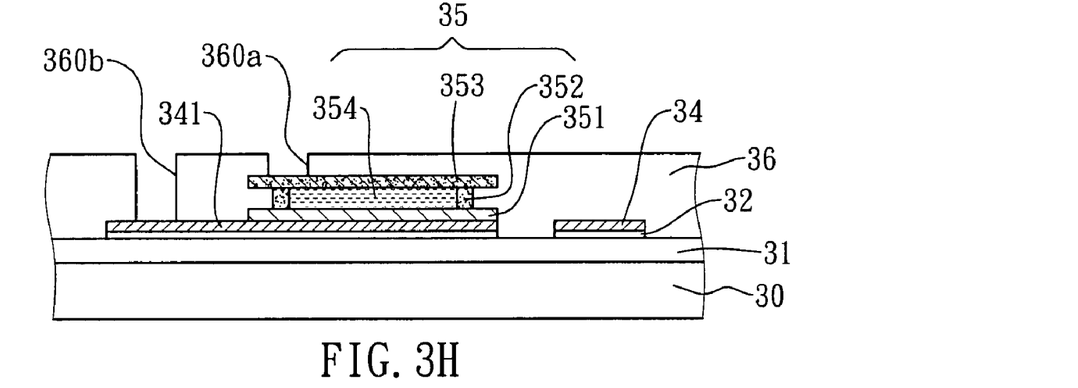
Figure 3I:
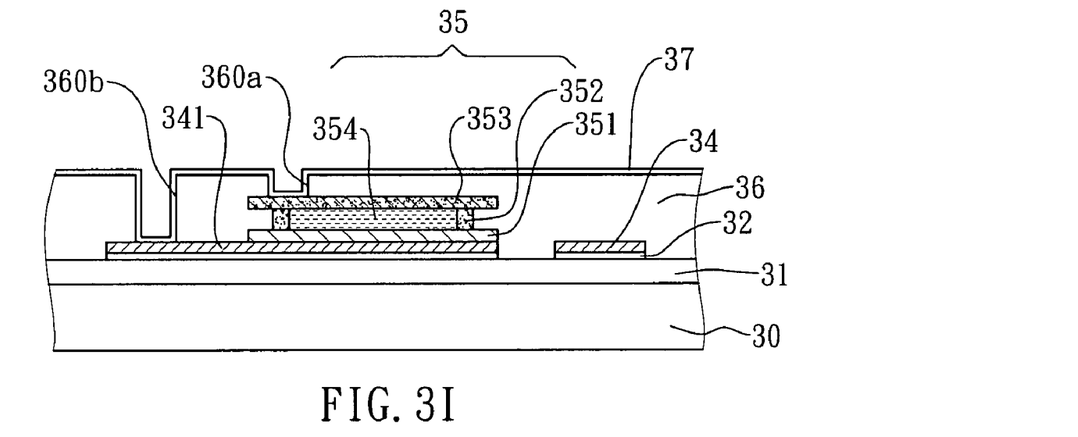
Figure 3J:
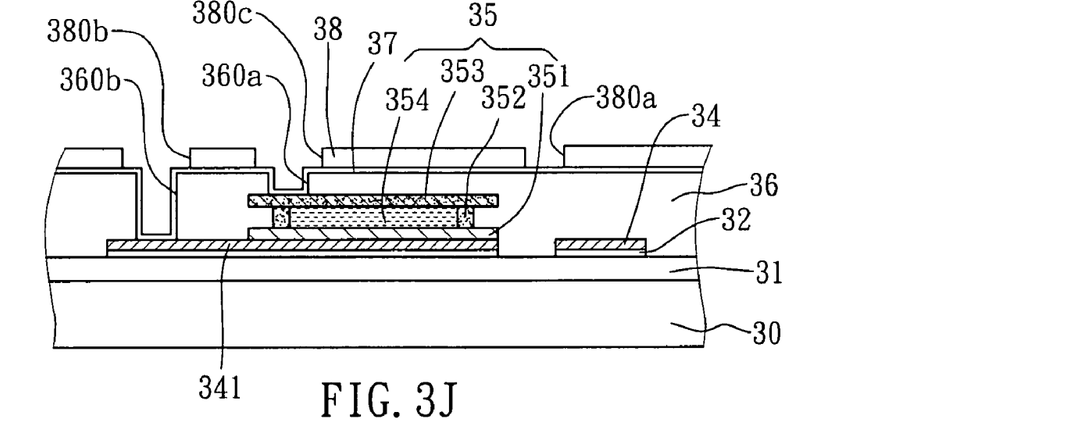
Figure 3K:
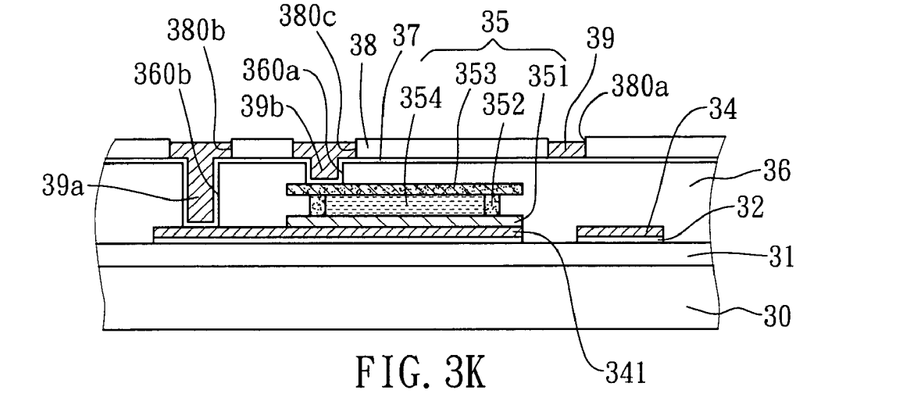
Figure 3L:
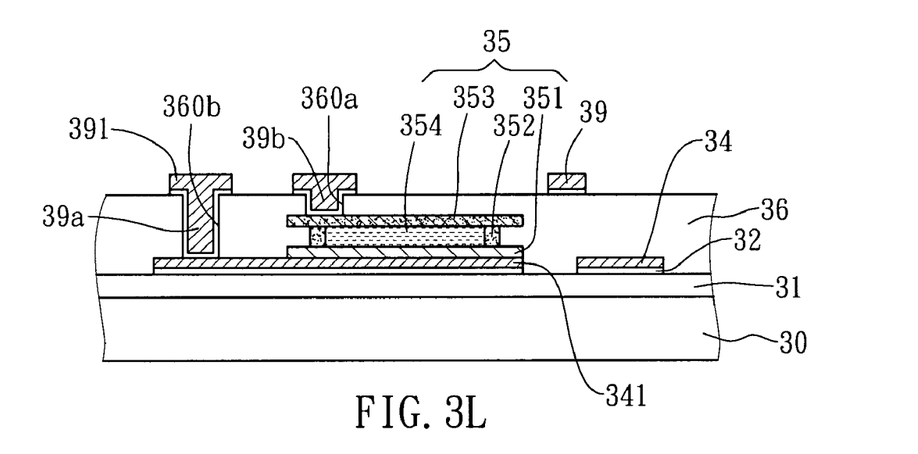
Figure 3M:
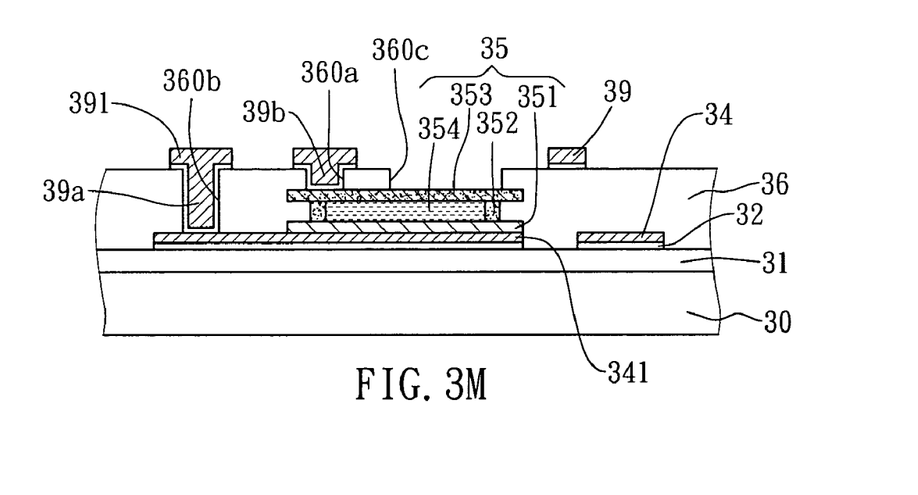
Figure 3N:
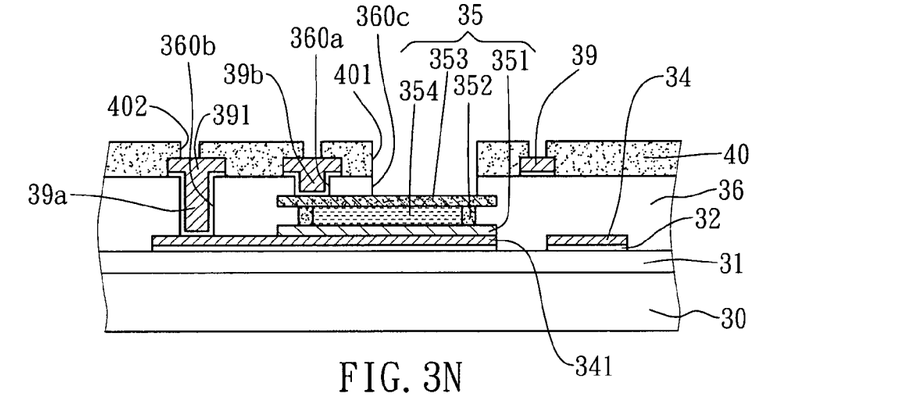

FIGS. 3A to 3N are cross-sectional views of a method for fabricating a circuit board having a power source according to the present invention.

Referring to FIG. 3A, first, a carrier board 30 having a first dielectric layer 31 formed on at least a surface thereof is provided. The carrier board 30 is an organic insulating board or an organic circuit board having inner circuit layers. The first dielectric layer 31 can be made of epoxy resin, polyimide, cyanate ester, glass fiber, bismaleimide triazine (BT), or a mixture of glass fiber and epoxy resin.

Referring to FIG. 3B, a first conductive layer 32 is formed on the first conductive layer 32. The first conductive layer 32 functions as a current conduction path required for subsequent electroplating of a metallic material. The first conductive layer 32 comprises metal, alloy, deposited multiple metal layer, or a polymer material filled with electrically conductive substance, which can be selected from the group consisting of copper, tin, nickel, chromium, titanium, copper-chromium alloy and tin-lead alloy. Alternatively, the first conductive layer 32 comprises an electrically conductive polymer material such as polyacetylene, polyaniline, or organosulfide polymer.

Referring to FIG. 3C, a first resist layer 33 is formed on the first conductive layer 32 by printing, spin-coating or lamination. The first resist layer 33 can be a dry film photoresist layer or a liquid photoresist layer, and is patterned by exposure and development so as to form cavities 330 for exposing portions of the first conductive layer 32.

Referring to FIG. 3D, an electroplating process is performed on the portions of the first conductive layer 32 exposed from the cavities 330 of the first resist layer 33. The first conductive layer 32 functions as the current conduction path to allow a first circuit layer 34 to be electroplated in the cavities 330, wherein the first circuit layer 34 has at least an electrode pad 341.

Referring to FIG. 3E, the first resist layer 33 and portions of the first conductive layer 32 covered with the first resist layer 33 are removed by stripping and etching so as to expose the first circuit layer 34. The first circuit layer 34 is electrically connected to a circuit layer (not shown) in the carrier board 30. There are various known techniques for fabricating conductive circuits and electrode pads in the art, and for the sake of brevity and not obscuring the technical features of the present invention, those conventional techniques for fabricating conductive circuits and electrode pads as used in the present invention are not further detailed here.

Referring to FIG. 3F, a fuel cell 35, which comprises a first electrode plate 351, an insulating frame member 352, electrolyte 354 and a second electrode plate 353, is disposed on the electrode pad 341 of the first circuit layer 34. The insulating frame member 352 is disposed on the first electrode plate 351, with a portion of the first electrode plate 351 being exposed. The insulating frame member 352 has a receiving space therein, such that the electrolyte 354 is received in the receiving space of the insulating frame member 352 and is in contact with the first electrode plate 351. The second electrode plate 353 is a porous board, and is disposed on the insulating frame member 352 and the electrolyte 354 and comes into contact with the electrolyte 354. The first electrode plate 351 can be made of zinc (Zn), aluminum (Al), or magnesium (Mg), and is electrically conductive as well as reactive with the electrolyte so as to provide a source of hydrogen. The electrolyte 354 is an OH⁻-containing alkaline solution, such as hydrogen peroxide ($H_2O_2$), sodium hydroxide (NaOH), or potassium hydroxide (KOH). The insulating frame member 352 comprises a pore-free insulating resin resistant to acid and alkali, or comprises a mixture of organic and inorganic materials. The insulating frame member 352 is round, rectangular, or polygonal. The second electrode plate 353 can be a porous metal board; or, the second electrode plate 353 can be a porous insulating board and a metal film is disposed on surfaces of pores of the porous insulating board. The porous insulating board can be made of aluminum oxide ($Al_2O_3$). The metal film can be made of copper (Cu), platinum (Pt), nickel (Ni), or gold (Au).

Referring to FIG. 3G, a second dielectric layer 36 is formed on the carried board 30, the second electrode plate 353 of the fuel cell 35 and the first circuit layer 34.

Referring to FIG. 3H, a plurality of openings 360a, 360b are formed in the second dielectric layer 36 by exposure and development, or by laser ablation, wherein the opening 360a exposes a portion of the second electrode plate 353, and the opening 360b exposes a portion of the first circuit layer 34.

Referring to FIG. 3I, a second conductive layer 37 is formed on the second dielectric layer 36, the exposed portion of the first circuit layer 34, and the exposed portion of the second electrode plate 353.

Referring to FIG. 3J, a second resist layer 38 is formed on the second conductive layer 37 by printing, spin-coating, or lamination. The second resist layer 38 is patterned by exposure and development so as to form a first cavity 380a, a second cavity 380b, and a third cavity 380c. The first cavity 380a exposes a portion of the second conductive layer 37. The second cavity 380b exposes a portion of the second conductive layer 37 corresponding to the opening 360b of the second dielectric layer 36. And, the third cavity 380c exposes a portion of the second conductive layer 37 corresponding to the opening 360a of the second dielectric layer 36. The second resist layer 38 can be a dry film photoresist layer or a liquid photoresist layer Referring to FIG. 3K, with the second conductive layer 37 being electrically conductive and serving as a current conduction path, an electroplating process is performed, such that a second circuit layer 39 having a first conductive pad 391 is formed in the first cavity 380a of the second resist layer 38, a first conductive via 39a is formed the second cavity 380b of the second resist layer 38, and a second conductive via 39b is formed in the third cavity 380c of the second resist layer 38. The first conductive via 39a electrically connects to the first circuit layer 34, and the second conductive via 39b electrically connects to the second electrode plate 353 of the fuel cell 35.

Referring to FIG. 3L, the second resist layer 38 and portions of the second conductive layer 37 covered with the second resist layer 38 are removed by stripping and etching, thereby having the second circuit layer 39 exposed.

Referring to FIG. 3M, a cavity 360c is formed in the second dielectric layer 36 by exposure and development or by laser ablation, such that a large portion of the second electrode plate 353 is exposed from the cavity 360c.

The second electrode plate 353 may obtain oxygen gas ($O_2$) (which is required for reaction) through the cavity 360c of the second dielectric layer 36. Accordingly, an electric current generated by reactions that take place at the first electrode plate 351 and the second electrode plate 352 provides power for the circuit board through the electrical connection of the first conductive via 39a and the second conductive via 39b.

Referring to FIG. 3N, an insulating protective layer 40 is formed on the second dielectric layer 36 and the second circuit layer 39. A plurality of openings 401, 402 are formed in the insulating protective layer 40, for exposing a large portion of the second electrode plate 353 and the first conductive pad 391, respectively. Alternatively, referring to FIG. 3N', a built-up circuit structure 41 may further be formed on the second circuit layer 39 and the second dielectric layer 36. The built-up circuit structure 41 comprises at least a third dielectric layer 411 and a third circuit layer 412 stacked on the third dielectric layer 411. The outermost circuit layer (or third circuit layer 412) has a plurality of second conductive pads 414. A plurality of third conductive vias 413 are formed in the third dielectric layer 411 and electrically connecting to the third circuit layer 412 and the second circuit layer 39. An insulating protective layer 40 is formed on the built-up circuit structure 41, and has a plurality of openings 401, 402 for exposing a large portion of the second electrode plate 353 and the second conductive pads 414, respectively.

Conductive components 415, such as solder balls, may be formed on the second conductive pads 414 respectively. At least a semiconductor chip 42 having conductive bumps 421 thereon is provided, and the conductive bumps 421 electrically connect to the conductive components 415 on the second conductive pads 414, so as to electrically connect the semiconductor chip 42 and the circuit board.

As shown in FIG. 3M, the present invention further provides a circuit board having a power source. The circuit board comprises: a carrier board 30 having a first dielectric layer 31 disposed on at least a surface thereof and a first circuit layer 34 disposed over the first dielectric layer 31, wherein the first circuit layer 34 has an electrode pad 341; a first electrode plate 351 disposed on the electrode pad 341; an insulating frame member 352 disposed on the first electrode plate 351, with a portion of the first electrode plate 351 being exposed from the insulating frame member 352, wherein electrolyte 354 is received in the insulating frame member 352 and in contact with the first electrode plate 351; a porous second electrode plate 353 disposed on the insulating frame member 352 and the electrolyte 354, wherein the second electrode plate 353 is in contact with the electrolyte 354; a second dielectric layer 36 disposed on the first dielectric layer 31, the first circuit layer 34 and the second electrode plate 353, wherein the second dielectric layer 36 has a cavity 360c therein to expose a large portion of the second electrode plate 353; and a second circuit layer 39 disposed on the second dielectric layer 36, wherein the second circuit layer 39 has at least a first conductive pad 391, and at least a first conductive via 39a and a second conductive via 39b both disposed in the second dielectric layer 36 and electrically connecting to the first circuit layer 34 and the second electrode plate 353 respectively.

As shown in FIG. 3N', the circuit board of the present invention may further comprises a built-up circuit structure 41 disposed on the second circuit layer 39 and the second dielectric layer 36. The built-up circuit structure 41 comprises at least a third dielectric layer 411 and a third circuit layer 412 stacked on the third dielectric layer 411. The outermost circuit layer (or third circuit layer 412) has a plurality of second conductive pads 414. A plurality of third conductive vias 413 are disposed in the third dielectric layer 411 and electrically connecting to the third circuit layer 412 and the second circuit layer 39. An insulating protective layer 40 is disposed on the built-up circuit structure 41, and has a plurality of openings 401, 402 for exposing a large portion of the second electrode plate 353 and the second conductive pads 414, respectively.

Furthermore, conductive components 415, such as solder balls, may be disposed on the second conductive pads 414 respectively. At least a semiconductor chip 42 having conductive bumps 421 thereon is provided, and the conductive bumps 421 electrically connect to the conductive components 415 on the second conductive pads 414, so as to electrically connect the semiconductor chip 42 and the circuit board. Alternatively, a conductive component such as a nickel/gold layer (not shown) can be disposed on the second conductive pads 414, and the semiconductor chip is electrically connected to the conductive component by bonding wires (not shown).

Therefore, according to the circuit board having a power source in the present invention, a carrier board is provided, and a first circuit layer having at least an electrode pad is disposed on the carrier board. A fuel cell, which comprises a first electrode plate, an insulating frame member, electrolyte, and a second electrode plate, is disposed on the electrode pad. A second dielectric layer having at least a cavity therein is disposed on the second electrode plate and the first circuit layer. A second circuit layer is disposed on the second dielectric layer, wherein the second circuit layer has at least a first conductive pad, at least a first conductive via, and at least a second conductive via therein, electrically connecting to the first circuit layer and the second electrode plate, respectively. The first circuit layer is electrically connected via its electrode pad to the first electrode plate. The second electrode plate obtains oxygen gas ($O_2$) (which is required for reaction) from an external environment through the cavity of the second dielectric layer. An electron stream produced by an oxidation reaction and a reduction reaction concurrently conducted at the first electrode plate and the second electrode plate, respectively, provides electric power for the circuit board by means of the first and second circuit layers. With a direct combination of the fuel cell and the circuit board in the present invention, the drawback of a considerable space occupied by a fuel cell disposed in a metal frame in the prior art is eliminated, and with the conductive vias being disposed in the circuit board of the present invention, a circuit layout distance can be shortened and thereby power consumption is reduced. Also, the circuit board incorporated with the fuel cell is light in weight and is less susceptible to cracking, thereby resolving the drawbacks of a conventional miniaturized fuel cell using a silicon substrate that is fragile, has unreliable supply of raw materials and is cost-ineffective to fabrication and the drawback of leakage of electrolyte in the prior art. Moreover, the circuit board of the present invention may incorporate multi-module chips for the purpose of versatility.

The invention has been described using exemplary preferred embodiments. However, it is to be understood that the scope of the invention is not limited to the disclosed arrangements. The scope of the claims, therefore, should be accorded the broadest interpretation, so as to encompass all such modifications and similar arrangements.

What is claimed is:

1. A circuit board having a power source, comprising:
a carrier board having a first dielectric layer disposed on at least a surface thereof and a first circuit layer disposed on the first dielectric layer, wherein the first circuit layer has at least an electrode pad;
a first electrode plate disposed on the electrode pad;
an insulating frame member disposed on the first electrode plate, with a portion of the first electrode plate being exposed from the insulating frame member, wherein electrolyte is received in the insulating frame member and in contact with the first electrode plate; and
a porous second electrode plate disposed on the insulating frame member and the electrolyte, wherein the second electrode plate is in contact with the electrolyte.

2. The circuit board of claim 1, further comprising:
a second dielectric layer disposed on the first dielectric layer, the first circuit layer and the second electrode plate, wherein the second dielectric layer has at least a cavity therein to expose the second electrode plate; and
a second circuit layer disposed on the second dielectric layer, wherein the second circuit layer has at least a first conductive pad, and at least a first conductive via and a second conductive via both disposed in the second dielectric layer and electrically connecting to the first circuit layer and the second electrode plate respectively.

3. The circuit board of claim 2, further comprising a built-up circuit structure disposed on the second dielectric layer and the second circuit layer, the built-up circuit structure comprising a plurality of third conductive vias disposed therein and electrically connecting to the second circuit layer, and at least an opening corresponding to the cavity of the second dielectric layer.

4. The circuit board of claim 3, wherein the built-up circuit structure further comprises at least a third dielectric layer and a third circuit layer stacked on the third dielectric layer, the third circuit layer having a plurality of second conductive pads, and wherein the plurality of third conductive vias are disposed in third dielectric layer and electrically connecting to the third circuit layer, and the built-up circuit structure is covered with an insulating protective layer having a plurality of openings therein to expose the second conductive pads.

5. The circuit board of claim 4, further comprising conductive components disposed on the second conductive pads.

6. The circuit board of claim 5, wherein the conductive components are electrically connected to a semiconductor chip by conductive bumps or bonding wires.

7. The circuit board of claim 1, wherein the carrier board is one of an organic insulating board and an organic circuit board having inner circuit layers.

8. The circuit board of claim 1, wherein the first electrode plate is made of one selected from the group consisting of zinc (Zn), aluminum (Al) and magnesium (Mg), and is electrically conductive as well as reactive with the electrolyte so as to provide a source of hydrogen.

9. The circuit board of claim 1, wherein the electrolyte is an $OH^-$-containing alkaline solution selected from the group consisting of hydrogen peroxide ($H_2O_2$), sodium hydroxide (NaOH) and potassium hydroxide (KOH).

10. The circuit board of claim 1, wherein the insulating frame member comprises a pore-free insulating resin resistant to acid and alkali.

11. The circuit board of claim 1, wherein the insulating frame member comprises a mixture of organic and inorganic materials.

12. The circuit board of claim 1, wherein the insulating frame member is round, rectangular, or polygonal.

13. The circuit board of claim 1, wherein the second electrode plate is a porous metal board.

14. The circuit board of claim 1, wherein the second electrode plate is a porous insulating board, and a metal film is disposed on surfaces of pores of the porous insulating board.

15. The circuit board of claim 14, wherein the porous insulating board is made of aluminum oxide ($Al_2O_3$).

16. The circuit board of claim 14, wherein the metal film is made of one selected from the group consisting of copper (Cu), platinum (Pt), nickel (Ni) and gold (Au).

* * * * *